（12) United States Patent
Champion et al.

(10) Patent No.: US 6,327,139 B1
(45) Date of Patent: Dec. 4, 2001

(54) ELECTRICAL EQUIPMENT RACK HAVING CABLE MANAGEMENT ARMS WITH FLEXIBLE LINKAGE

(75) Inventors: David Frederick Champion, Durham; Kevin D. Johnson, Apex; Michael Sven Miller, Raleigh; Glenn Edward Myrto, Holly Springs; Brian Alan Trumbo, Apex, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/532,108

(22) Filed: Mar. 21, 2000

(51) Int. Cl.$^7$ .................................... H02B 11/12
(52) U.S. Cl. .................. 361/608; 174/69; 174/72 A; 174/DIG. 9; 361/725; 361/727; 361/826
(58) Field of Search .................. 174/69.48, 72 A, 174/DIG. 9, 135; 211/26; 312/222, 223, 265.1, 265.4; 439/49, 34, 532; 361/608, 724–727, 825–828; 191/12 R, 122 R, 12 C

(56) References Cited
U.S. PATENT DOCUMENTS 3,335,326 * 8/1967 Bonin et al. .................. 361/727
5,460,441 * 10/1995 Hastinngs et al. .................. 361/727
5,726,866 * 3/1998 Allen .................. 361/727

* cited by examiner

Primary Examiner—Gregory Thompson
(74) Attorney, Agent, or Firm—Martin J. McKinley

(57) ABSTRACT

An electrical equipment rack includes an electrical equipment unit that slides in and out of the rack on two drawer slides. A hinge attaches a first cable management arm to the rack or to a first drawer slide, which is attached to the rack. Another hinge attaches a second cable management arm to the equipment unit or to a second drawer slide, which is attached to the equipment unit. A flexible linkage is connected between and joins each of the free ends of the two cable management arms. Cables for interconnecting two or more equipment units are attached to the cable management arms and flexible linkage. The equipment unit can be extended out the front or back of the rack for servicing, and each of the cable management arms can be rotated away from the equipment unit to permit easy access to the unit. The flexible linkage limits the bend radii of the cables without regard to the position of the cable management arms or the position of the equipment unit relative to the rack. In another embodiment, a single flexible cable management arm is used instead of the two cable management arms and flexible linkage.

24 Claims, 6 Drawing Sheets

ELECTRICAL EQUIPMENT RACK HAVING CABLE MANAGEMENT ARMS WITH FLEXIBLE LINKAGE

BACKGROUND OF THE INVENTION

This invention pertains to electrical equipment housings or "racks" for receiving slidably mounted electrical equipment units and, more particularly, to a cable management arm and flexible linkage assembly for use in such racks.

It is well known to mount one or more electrical equipment units, each contained in its own housing, in a larger housing called a "rack." The rack is usually vertically oriented so that one equipment unit is mounted above or below another equipment unit. Each equipment unit may be rigidly mounted in the rack, or it may be slidably attached to the rack through the use of well known drawer slides, which permit each equipment unit to slide (within the limits of the drawer slides) out of the front or the back of the rack to facilitate installation, removal, servicing and adjustment of the equipment unit. Electrical or optical cables are used to interconnect one equipment unit to another and are usually routed along the back of the rack, which may be uncovered or accessible through a door that is hinged to the back of the rack.

Because of the sheer number of cables that may be located in the back of the rack, problems are frequently encountered when attempting to service, adjust or remove an existing equipment unit in the rack, or to install a new equipment unit in the rack. The severity of the problem increases when drawer slides are used, and the problem can become particularly acute when very deep (distance from front to back) equipment units are mounted in the rack, because deeper units require more travel when sliding the unit in or out of the rack. Adding to this problem are the cables themselves, which may be thick and stiff and, consequently, not easily bendable in the limited space found at the back of the rack. Furthermore, some cables, such as fiber optic cables, require minimum bend radii to insure that there is no breakage of the glass fibers in the optical cables.

Accordingly, the invention described below is a rack and cable management assembly that can manage a large number of cables. The cable management assembly organizes and collects the cables in appropriate cable groups and allows the cables to swing out of the way to permit access to each equipment unit for servicing and adjustment, or for the installation or removal of an equipment unit. The cable management assemble also provides these advantages while permitting each equipment unit to slide a considerable distance out the front or back of the rack. Furthermore, the cable management system described below also limits the bend radius of the cables as each equipment unit slides in and out of the rack on its drawer slides.

SUMMARY OF THE INVENTION

Briefly, the invention is an electrical equipment rack having a housing and a first drawer slide connected to the housing. A drawer assembly includes a second drawer slide and an electrical equipment unit, and the second drawer slide is connected to the first drawer slide such that the second drawer slide can slide relative to the first drawer slide. The equipment unit is connected to the second drawer slide such that the equipment unit can slide relative to the housing. A first end of a first cable management arm is movably connected to the housing. A first end of a second cable management arm is movably connected to the drawer assembly. A flexible cable member has first and second ends, wherein the first end of the flexible cable member is connected to the second end of the first cable management arm, and the second end of the flexible cable member is connected to the second end of the second cable management arm, such that the flexible cable member forms an arcuate shape between the second ends of the first and second cable management arms.

In another embodiment, the invention is a cable management assembly for use with an electrical equipment rack having a first drawer slide coupled to a housing and a drawer assembly having a second drawer slide coupled to an electrical equipment unit. The second drawer slide is connected to the first drawer slide such that the equipment unit can slide relative to the housing. The cable management assembly includes a first cable management arm having first and second ends, the first end of the first cable management arm has a first attaching mechanism for movably coupling the first cable management arm to the housing. A second cable management arm has first and second ends and the first end of the second cable management arm has a second attaching mechanism for movably coupling the first cable management arm to the drawer assembly. A flexible cable member has first and second ends. The first end of the flexible cable member is connected to the second end of the first cable management arm, and the second end of the flexible cable member is connected to the second end of the second cable management arm, such that the flexible cable member forms an arcuate shape between the second ends of the first and second cable management arms.

In another embodiment, the invention is an electrical equipment rack including a housing assembly having a housing and a first drawer slide coupled to the housing. A drawer assembly includes a second drawer slide and an electrical equipment unit. The second drawer slide is coupled to the first drawer slide such that the second drawer slide can slide relative to the first drawer slide. The equipment unit is coupled to the second drawer slide such that the equipment unit can slide relative to the housing. A flexible cable management arm has first and second ends, wherein the first end of the flexible cable management arm is coupled to the housing assembly, and the second end of the flexible cable management arm is coupled to the drawer assembly. A cable is attached to the flexible cable management arm. The flexible cable management arm maintains a minimum bend radius of the cable when the electrical equipment unit is slidably moved relative to the housing.

In yet another embodiment, the invention is a cable management assembly for use with an electrical equipment rack including a housing assembly having a first drawer slide coupled to a housing, and further including a drawer assembly having a second drawer slide coupled to an electrical equipment unit. The second drawer slide is coupled to the first drawer slide such that the equipment unit can slide relative to the housing. The cable management assembly includes a flexible cable management arm having first and second ends. The first end has a first coupling mechanism for coupling to the housing assembly, and the second end has a second coupling mechanism for coupling to the drawer assembly. The flexible cable management arm includes a plurality of cable retention mechanisms for attaching a cable to the flexible cable management arm.

DESCRIPTION OF THE PREFERRED EMBODIMENTS

Figure 1:
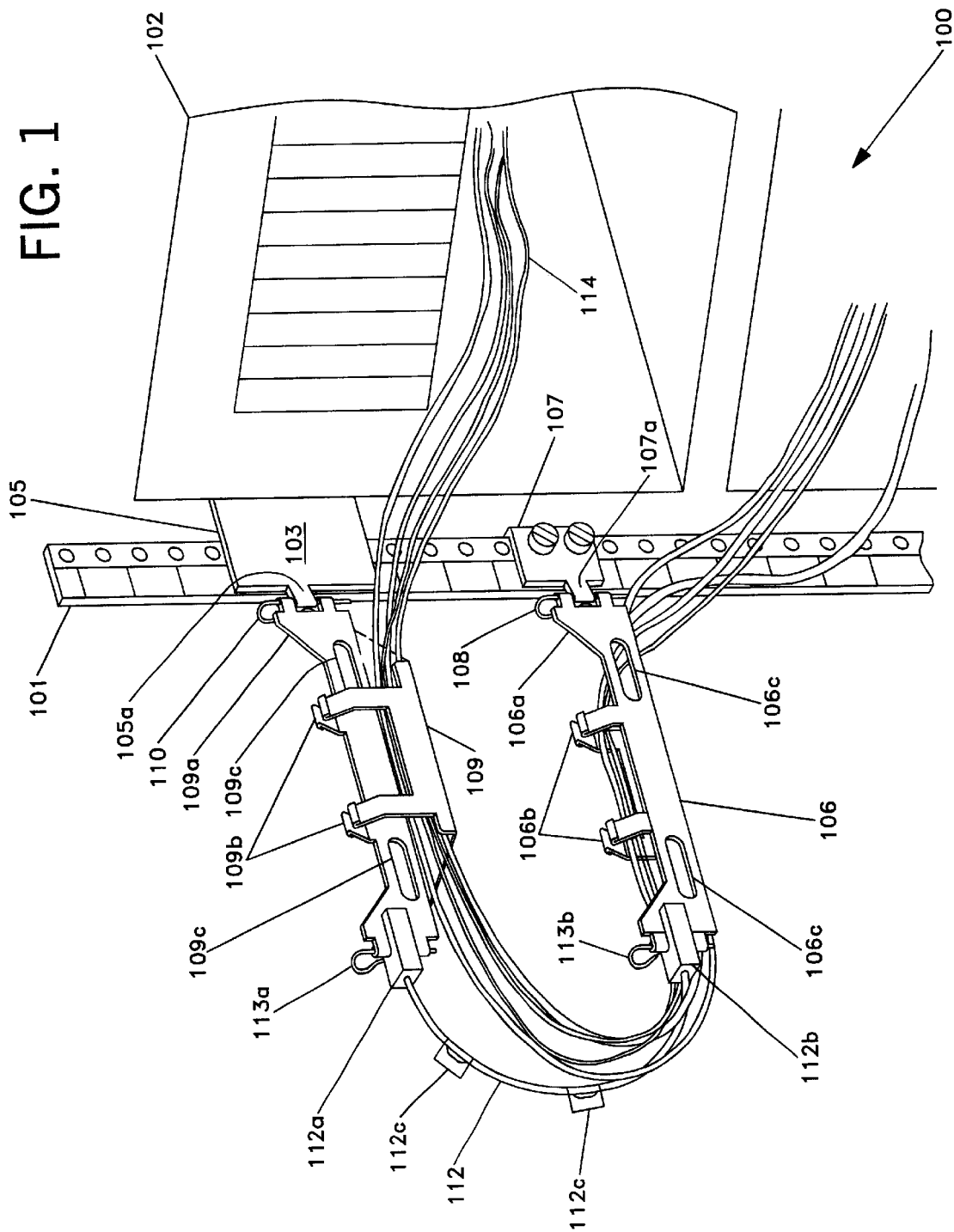
FIG. 1 is a perspective view of the rear of an equipment rack in which the equipment unit is positioned in a serviceable position towards the back of the rack, and the two cable management arms are outwardly extended to permit easy access to the back of the equipment unit.

FIG. 1 is a perspective view of the rear of an equipment rack in which two cable management arms are illustrated in an outwardly extended position. Referring to this figure, an electrical equipment rack assembly 100 includes a housing or rack 101. An electrical equipment unit 102 is slidably mounted in rack 101 by a well known drawer slide assembly 103 (although a two piece drawer slide is illustrated, any number of slide sections may be used based upon the weight of the electrical equipment and the distance it is required to extend). Equipment unit 102 may be any well known computer, communications, electronic or other well known electrical equipment unit. Drawer slide assembly 103 includes a first drawer slide 104 (visible in FIG. 3) which is attached to rack 101 and a second drawer slide 105 which is attached to equipment unit 102. Second drawer slide 105 is slidably attached to first drawer slide 104 such that equipment unit 102 can slide relative to rack 101.

A first cable management arm 106 includes a hinge portion 106a for movably connecting the cable arm to rack 101. A bracket 107 is attached to rack 101 and includes a hinge portion 107a. A hinge pin 108 movably attaches the hinge portion 106a of cable arm 106 to the hinge portion 107a of bracket 107, thereby permitting cable arm 106 to rotate about the hinge pin. Cable arm 106 includes rigid or deformable tabs 106b for securing cables 114 to the arm, although other well known means for attaching cables 114 to arm 106 may also be used. For example, cables 114 could be attached to cable arm 106 using a strap 115 made from well known hook and loop (Velrco®) material or, in the alternative, well know plastic cable ties can be used. Other strap mechanisms and materials well known in the art may also be used. Slots 106c may also be provided in cable arm 106 into which attaching straps, such as strap 115, can be inserted and then wrapped around cable 114 to attach cable 114 to the cable arm.

A second cable management arm 109 includes a hinge portion 109a for movably connecting the cable arm to drawer slide 105 or directly to equipment unit 102 (it is preferred to connect directly to the drawer slide so that the equipment unit can be detached from the drawer slide without having to detach the cable arm). Drawer slide 105 includes a hinge portion 105a. A hinge pin 110 movably attaches the hinge portion 109a of cable arm 109 to the hinge portion 105a of drawer slide 105, thereby permitting cable arm 109 to rotate about the hinge pin. Cable arm 109 also includes rigid or deformable tabs 109b for securing cables 114 to the arm. In the alternative, a hook and loop strap 116 or other straps well known in the art, such as a well know plastic cable tie, may be used to attach cables 114 to cable arm 109. Cable arm 109 may also be provided with one or more slots 109c into which an attaching strap may be inserted to secure cables 114 to the cable arm. Other well known means for attaching cables 114 to cable arm 109 may also be used.

Preferably, hinge pins 108 and 110 are pins that can be easily removed without the use of tools, such as well known "hitch pins" (illustrated) or grenade pins (a pin with a "quick disconnect" ball bearing at one end of the pin and means for grasping the pin between the fingers at the opposite end). If cable arms 106 or 109 were manufactured from injection molded plastic (or, the hinge portions 106a and 109a are injection molded), then the hinges that join arms 106 and 109 to rack 101 and drawer slide 103 may be fabricated as well known injection molded "living hinges." In the alternative, these hinges may be constructed using a flexible material rather than the mechanical hinge pin mechanisms illustrated in the drawings.

A flexible, resilient member 112 includes an attaching block 11 2a and 11 2b at each end of the flexile member for connecting the flexible member to the free ends of cable arms 106 and 109. Each of the attaching blocks 112a and 112b includes a hole into which an attaching pin 113a and 113b is inserted. The attaching pins 113a and 113b are also inserted through holes in each end of the cable management arms 106 and 109 to attach the flexible member 112 to the cable arms. When so attached, the flexible member assumes an arcuate shape that has a minimum bend radius. As cable arms 106 and 109 are moved about their hinges, or equipment unit 102 is moved in and out of rack 101, this flexible member 112 never exceeds the minimum bend radius such that any cables 114 that are attached to the flexible member also never exceed the minimum bend radius. Tabs 112c (three are preferred) are preferably molded into flexible member 112 and include slots for receiving attaching straps (similar to strap 115 or 116 described above) to attach cable 114 to the flexible member. Flexible member 112 is preferable made from an elastomer alloy, such as Santoprene (trademark of Advanced Elastomer Systems), and is circular in cross section and approximately 7–8 mm in diameter. Other well known flexible materials, cross sectional shapes and diameters may also be suitable. It should be noted that some cable types are self supporting and may not require direct attachment to flexible member 112. Other cable types, however, such as telephone or fiber optic cable, are not self supporting and should be attached to flexible member 112 as described above.

Figure 2:
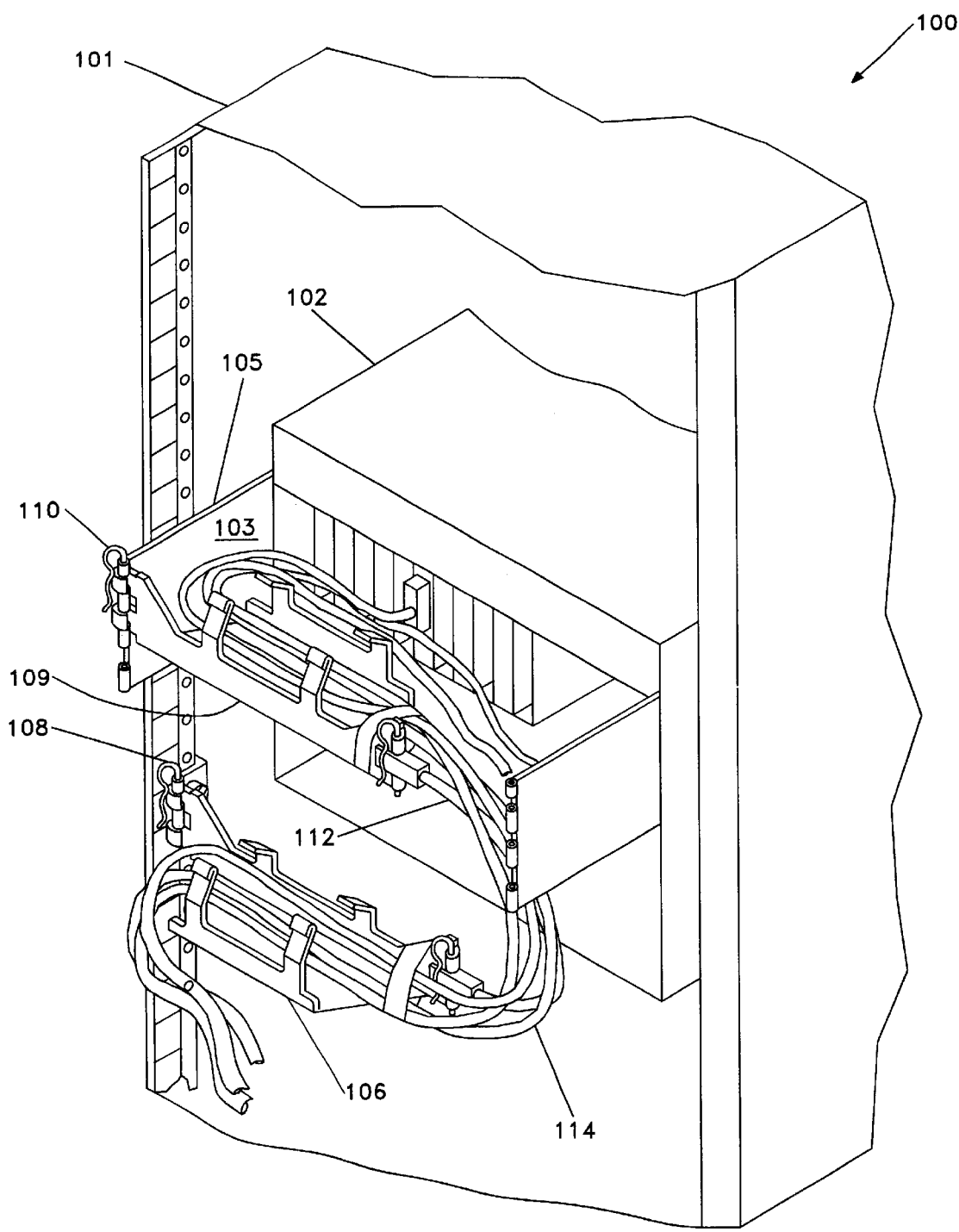
FIG. 2 is a perspective view of the rear of an equipment rack in which the equipment unit is positioned in its normal operating position, and the two cable management arms are illustrated in the folded position.
Figure 3:
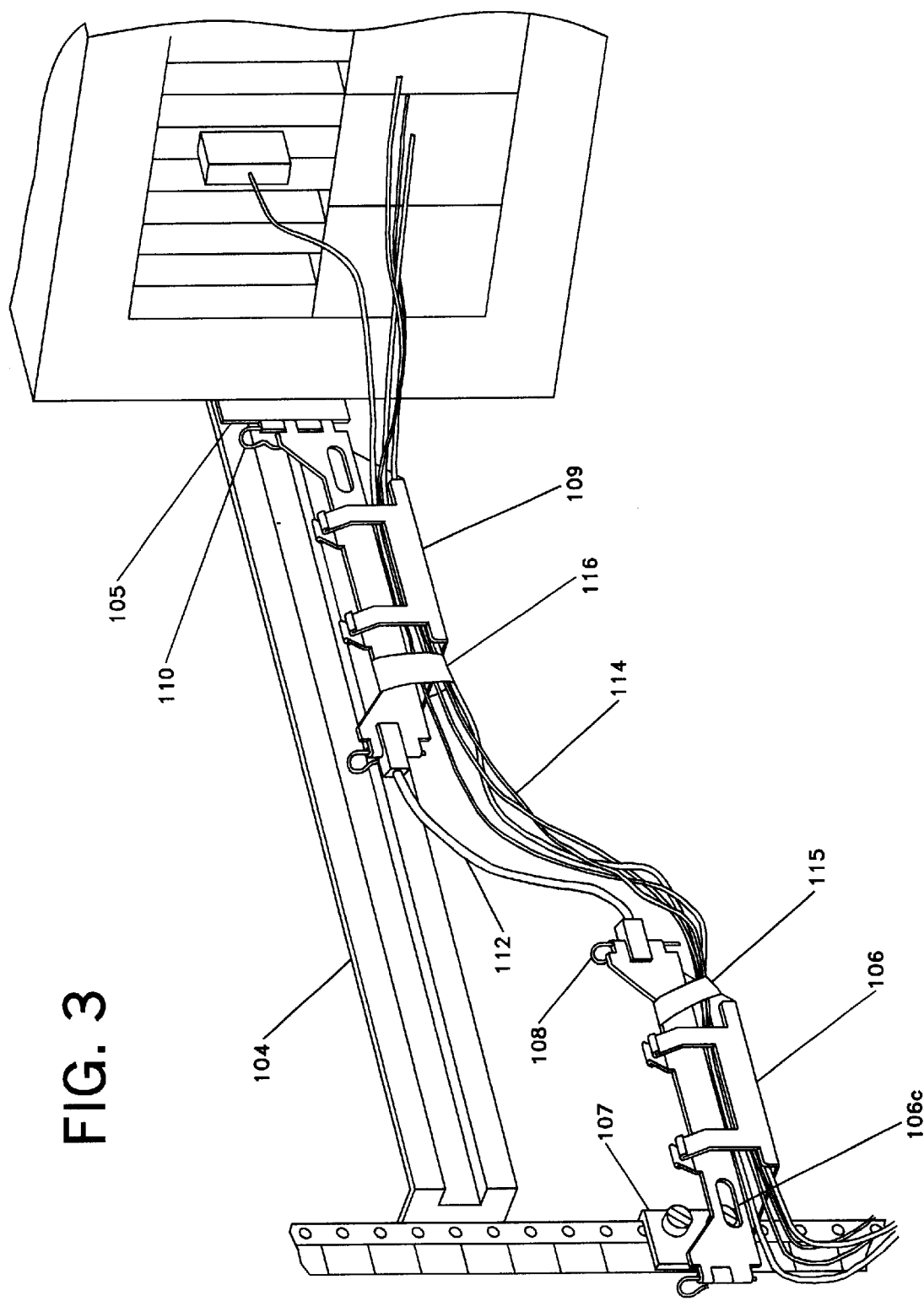
FIG. 3 is a perspective view of the rear of an equipment rack in which the equipment unit is positioned in a serviceable position towards the front of the rack, and the first cable management is inwardly extended and the second cable management arm is outwardly extended to permit easy access to the back of the equipment unit.
Figure 4:
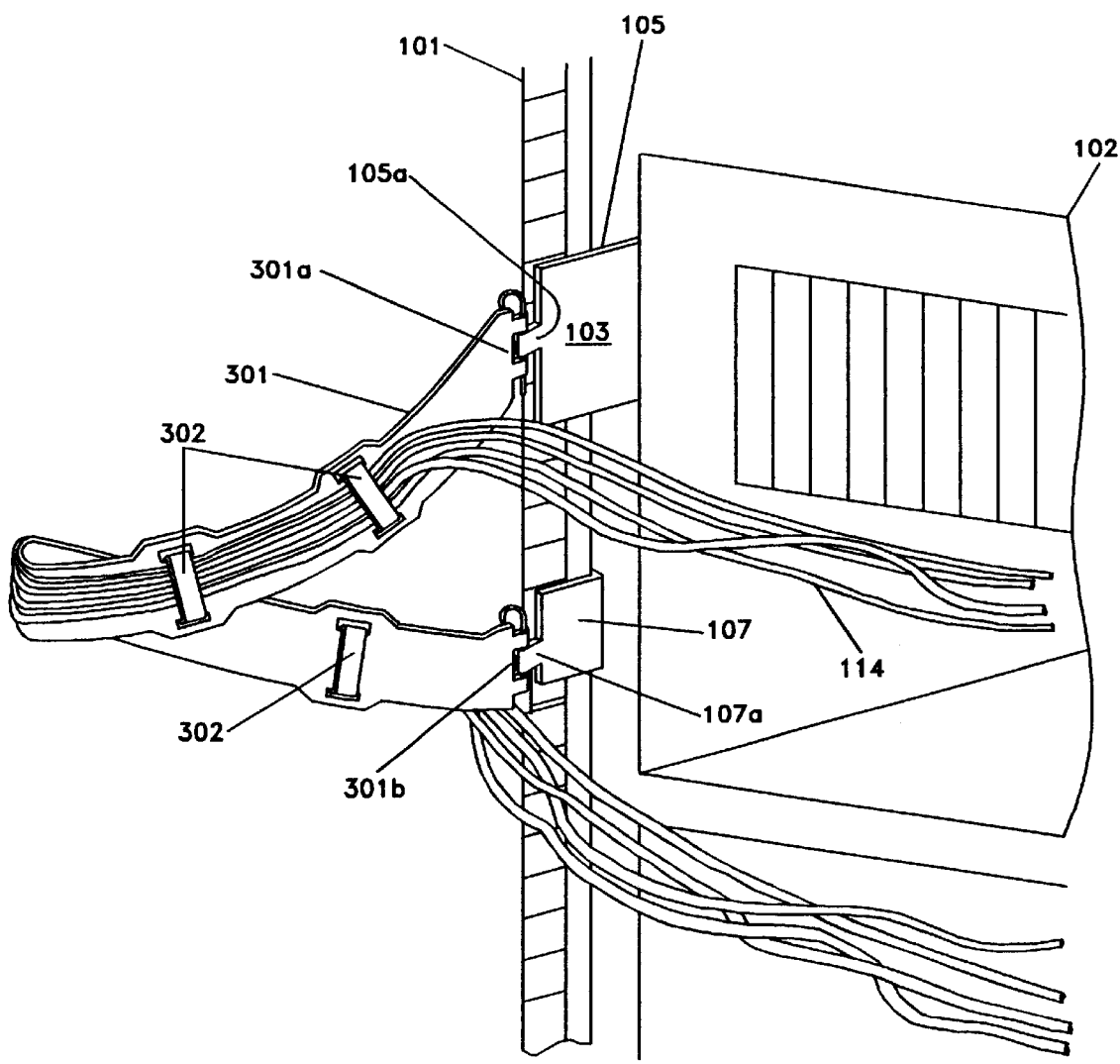
FIG. 4 is a perspective view similar to FIG. 1, but employing a flexible cable management arm.
Figure 5:
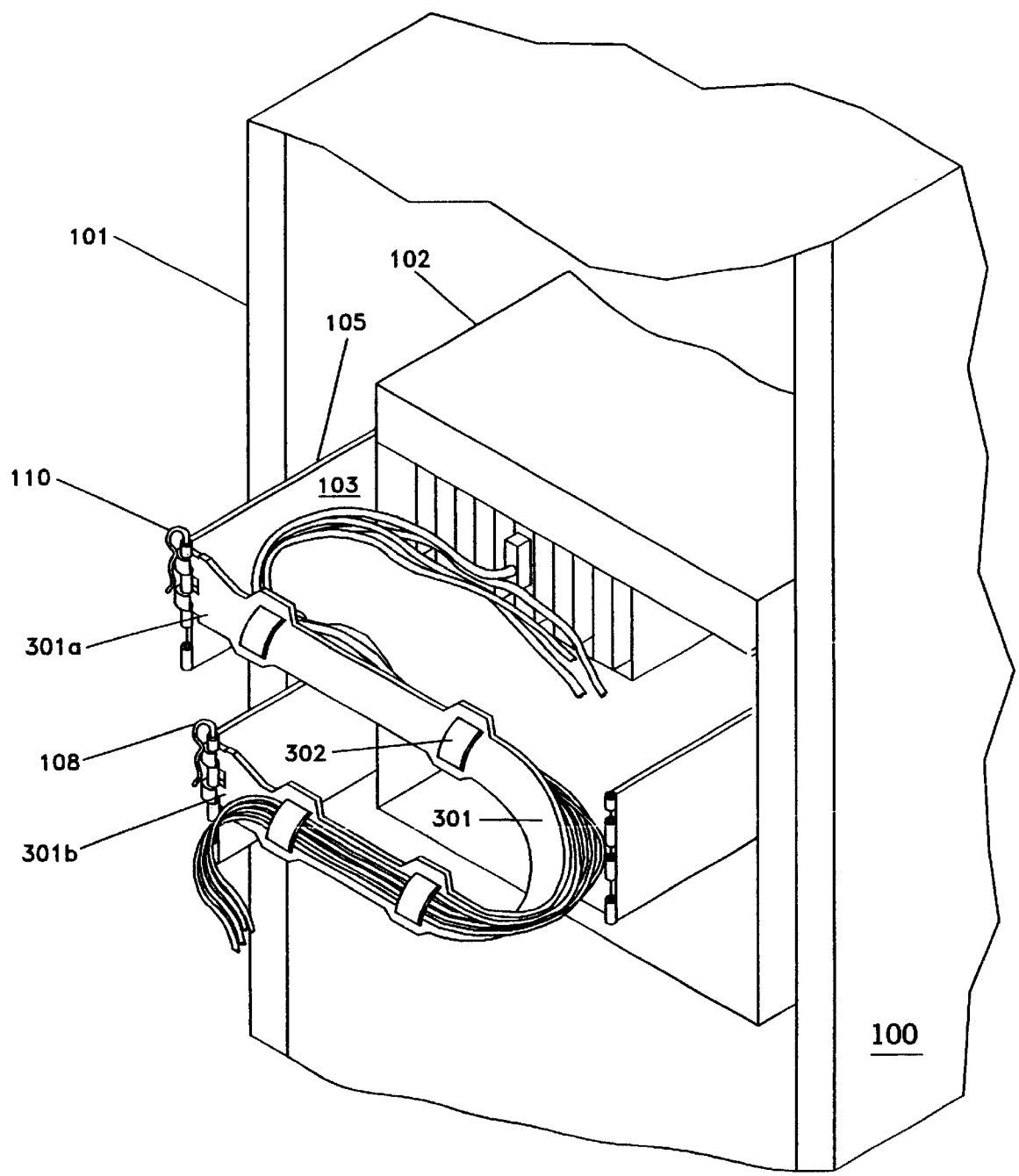
FIG. 5 is a perspective view similar to FIG. 2, but employing a flexible cable management arms.
Figure 6:
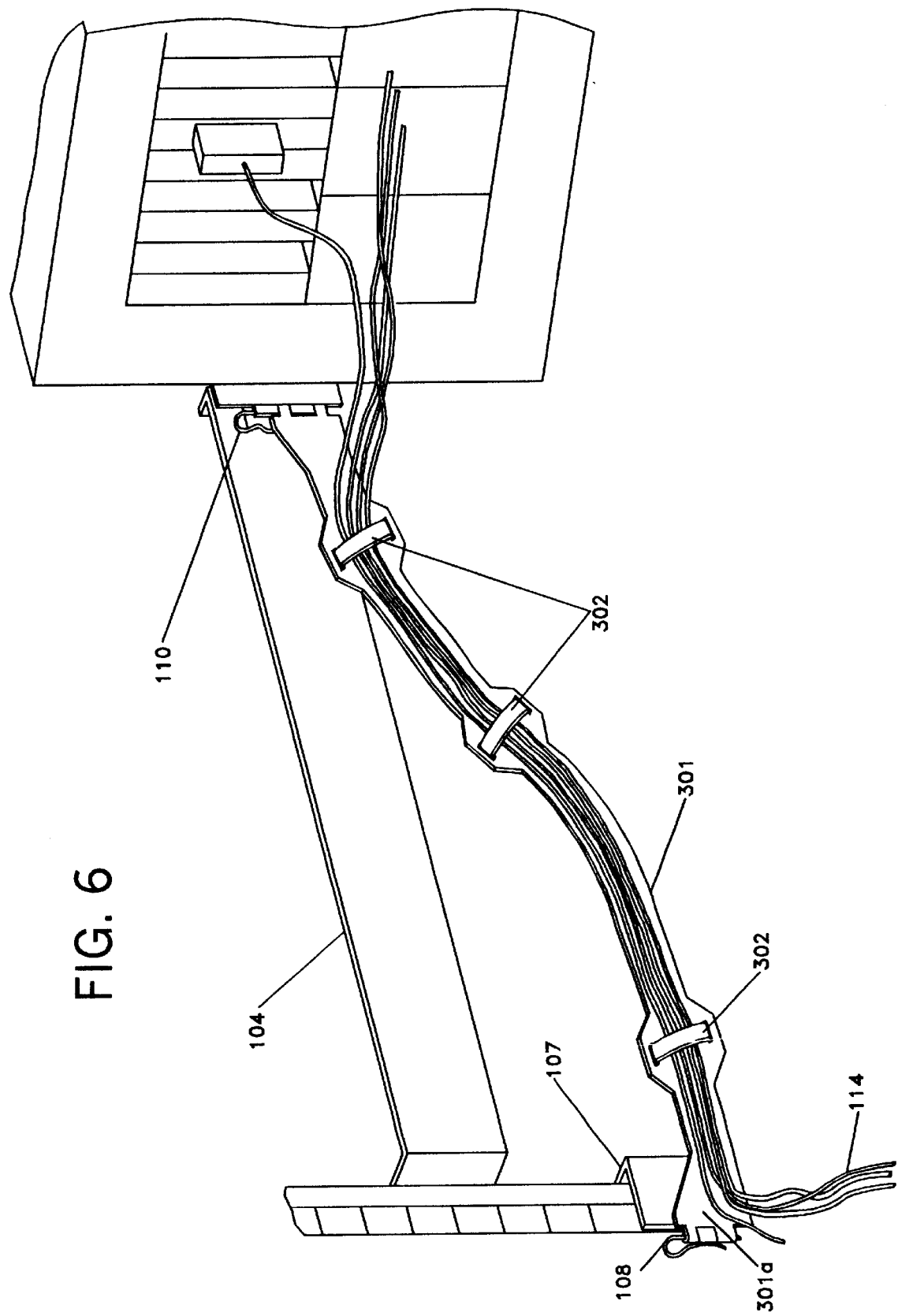
FIG. 6 is a perspective view similar to FIG. 3, but employing a flexible cable management arm.

FIG. 2 is a perspective view of the rear of an equipment rack in which the equipment unit is positioned in its normal operating position, and the two cable management arms are illustrated in the folded position. FIGS. 1 and 3, however, illustrate the equipment rack in which the equipment unit and cable management arms are positioned in a serviceable position. Specifically, FIG. 1 is a perspective view of the rear of an equipment rack in which the equipment unit is positioned towards the back of the rack, and the two cable management arms are outwardly extended to permit easy access to the back of the equipment unit. And FIG. 3 is a perspective view of the rear of an equipment rack in which the equipment unit is positioned towards the front of the rack, and the first cable management arm 106 is inwardly extended and the second cable management arm 109 is outwardly extended to permit easy access to the back of the equipment unit. Referring to these figures, note that in the standard position of FIG. 2, as well as the serviceable positions of FIGS. 1 and 3, the flexible member 112 never exceeds a minimum bend radius and, therefore, any cables that may be attached to the flexible member are protected from breakage or malfunction because of the flexible member and its minimum bend radius characteristics. Referring to FIGS. 4–6 wherein another embodiment of the invention is illustrated in which a single flexible cable management arm 301 replaces the two cable management arms (106 and 109) and flexible cable member 112 of the previous embodiment. In this embodiment, flexible cable management arm 301 is, preferably, made from an elastomeric alloy such as Santoprene. One end 301a of flexible cable management arm 301 includes a pivotal attaching mechanism, such as a hinge mechanism, for attaching the cable management arm to hinge mechanism 105a of second drawer slide 105. The other end 301b of flexible cable management arm 301 also includes a pivotal attaching mechanism, such as a hinge mechanism, for attaching the cable management arm to hinge mechanism 107a of bracket 107. Cable 114 is attached to flexible cable management arm 301 through a plurality of well known cable retention mechanisms 302. As can be seen in FIGS. 4–6, as the electrical equipment unit 102 slides relative to housing 101, flexible cable management arm 301 maintains a minimum bend radius for cable 114, which is particularly important for the prevention of damage to fiber cable.

We claim:

1. An electrical equipment rack, comprising:
   a housing assembly including a housing and a first drawer slide coupled to said housing;
   a drawer assembly comprising a second drawer slide and an electrical equipment unit, said second drawer slide being coupled to said first drawer slide such that said second drawer slide can slide relative to said first drawer slide, said equipment unit being coupled to said second drawer slide such that said equipment unit can slide relative to said housing;
   a first cable management arm having first and second ends, said first end of said first cable management arm being movably coupled to said housing assembly;
   a second cable management arm having first and second ends, said first end of said second cable management arm being movably coupled to said drawer assembly; and
   a flexible cable member having first and second ends, said first end of said flexible cable member being coupled to said second end of said first cable management arm, and said second end of said flexible cable member being coupled to said second end of said second cable management arm, such that said flexible cable member forms an arcuate shape between said second ends of said first and second cable management arms.

2. The electrical equipment rack of claim 1, further comprising a hinge coupling said second cable management arm to said second drawer slide.

3. The electrical equipment rack of claim 2, wherein said hinge includes a removable hinge pin to permit said second cable management arm to be separated from said second drawer slide, said hinge pin being removable without the use of a tool.

4. The electrical equipment rack of claim 2, further comprising a cable retention mechanism for connecting cables to said second cable management arm.

5. The electrical equipment rack of claim 1, further comprising a hinge coupling said second cable management arm to said equipment unit.

6. The electrical equipment rack of claim 5, wherein said hinge includes a removable hinge pin to permit said second cable management arm to be separated from said equipment unit, said hinge pin being removable without the use of a tool.

7. The electrical equipment rack of claim 5, further comprising a cable retention mechanism for connecting cables to said second cable management arm.

8. The electrical equipment rack of claim 1, further comprising a hinge coupling said second cable management arm to said drawer assembly, said hinge including a removable hinge pin to permit said second cable management arm to be separated from said drawer assembly, said hinge pin being removable without the use of a tool.

9. The electrical equipment rack of claim 1, further comprising a cable retention mechanism for connecting cables to said second cable management arm.

10. A cable management assembly for use with an electrical equipment rack including a housing assembly having a first drawer slide coupled to a housing, and including a drawer assembly having a second drawer slide coupled to an electrical equipment unit, the second drawer slide being coupled to the first drawer slide such that the equipment unit can slide relative to the housing, the cable management assembly comprising:
    a first cable management arm having first and second ends, said first end of said first cable management arm having a first attaching mechanism for movably coupling said first cable management arm to the housing assembly;
    a second cable management arm having first and second ends, said first end of said second cable management arm having a second attaching mechanism for movably coupling said second cable management arm to the drawer assembly; and
    a flexible cable member having first and second ends, said first end of said flexible cable member being coupled to said second end of said first cable management arm, and said second end of said flexible cable member being coupled to said second end of said second cable management arm, such that said flexible cable member forms an arcuate shape between said second ends of said first and second cable management arms.

11. The cable management assembly of claim 10, wherein said second attaching mechanism includes a hinge for coupling said second cable management arm to the second drawer slide.

12. The cable management assembly of claim 11, wherein said hinge includes a removable hinge pin to permit said second cable management arm to be separated from the second drawer slide, said hinge pin being removable without the use of a tool.

13. The cable management assembly of claim 11, further comprising a cable retention mechanism for connecting cables to said second cable management arm.

14. The cable management assembly of claim 10, wherein said second attaching mechanism includes a hinge for coupling said second cable management arm to the equipment unit.

15. The cable management assembly of claim 14, wherein said hinge includes a removable hinge pin to permit said second cable management arm to be separated from the equipment unit, said hinge pin being removable without the use of a tool.

16. The cable management assembly of claim 14, further comprising a cable retention mechanism for connecting cables to said second cable management arm.

17. The cable management assembly of claim 10, wherein said second attaching mechanism includes a hinge for coupling said second cable management arm to the drawer assembly, said hinge including a removable hinge pin to permit said second cable management arm to be separated from the drawer assembly, said hinge pin being removable without the use of a tool.

18. The cable management assembly of claim 10, further comprising a cable retention mechanism for connecting cables to the second cable management arm.

19. An electrical equipment rack, comprising:

a housing assembly including a housing and a first drawer slide coupled to said housing;

a drawer assembly comprising a second drawer slide and an electrical equipment unit, said second drawer slide being coupled to said first drawer slide such that said second drawer slide can slide relative to said first drawer slide, said equipment unit being coupled to said second drawer slide such that said equipment unit can slide relative to said housing;

a flexible cable management arm having first and second ends, said first end of said flexible cable management arm being coupled to said housing assembly, and said second end of said flexible cable management arm being coupled to said drawer assembly; and a cable attached to said flexible cable management arm;

whereby, said flexible cable management arm maintains a minimum bend radius of said cable when said electrical equipment unit is slidably moved relative to said housing.

20. The electrical equipment rack of claim 19, further comprising a hinge coupling said flexible cable management arm to said drawer assembly.

21. The electrical equipment rack of claim 20, further comprising a cable retention mechanism attaching said cable to said flexible cable management arm.

22. The electrical equipment rack of claim 19, further comprising a cable retention mechanism attaching said cable to said flexible cable management arm.

23. A cable management assembly for use with an electrical equipment rack including a housing assembly having a first drawer slide coupled to a housing, and including a drawer assembly having a second drawer slide coupled to an electrical equipment unit, the second drawer slide being coupled to the first drawer slide such that the equipment unit can slide relative to the housing, the cable management assembly comprising:

a flexible cable management arm having first and second ends, said first end having a first coupling mechanism for coupling to the housing assembly, and said second end having a second coupling mechanism for coupling to the drawer assembly; and said flexible cable management arm including a plurality of cable retention mechanisms for attaching a cable to said flexible cable management arm.

24. The cable management assembly of claim 23, wherein said first coupling mechanism includes a hinge.

* * * * *